(12) United States Patent
Loibl et al.

(10) Patent No.: US 6,180,880 B1
(45) Date of Patent: *Jan. 30, 2001

(54) ELECTRONIC CONTROL UNIT WITH A CONTACT PIN, AND METHOD OF PRODUCING THE CONTROL UNIT

(75) Inventors: Josef Loibl, Regen; Helmut Gander, Regensburg, both of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/130,139

(22) Filed: Aug. 6, 1998

(30) Foreign Application Priority Data

Aug. 6, 1997 (DE) .............................. 197 34 032

(51) Int. Cl.⁷ ...................................... H05K 5/06
(52) U.S. Cl. .............. 174/52.3; 29/743; 29/840; 439/67; 361/749
(58) Field of Search ............... 174/52.3; 29/840, 29/743; 439/67; 361/749

(56) References Cited

U.S. PATENT DOCUMENTS

| 3,585,272 | * | 6/1971 | Solomon ............... 174/52 S |
| 4,352,119 | * | 9/1982 | Bardens et al. ........... 357/78 |
| 4,751,482 | * | 6/1988 | Fukuta et al. ........... 333/247 |
| 4,951,011 | * | 8/1990 | Heckaman et al. ......... 333/33 |
| 5,832,598 | * | 11/1998 | Greenman et al. .......... 29/840 |
| 5,928,002 | * | 7/2000 | Loibl ..................... 439/67 |
| 5,996,222 | * | 12/1999 | Shangguan et al. ......... 29/840 |
| 6,104,618 | * | 8/2000 | Loibl .................... 361/749 |

FOREIGN PATENT DOCUMENTS

| 2509507 | 10/1975 | (DE) . |
| 44 39 471 A1 | 5/1996 | (DE) . |
| 19541925A1 | 5/1997 | (DE) . |
| 0113073A1 | 7/1984 | (EP) . |
| 0 664 576 A2 | 7/1995 | (EP) . |
| 0 695 117 A1 | 1/1996 | (EP) . |
| 0 820 119 A1 | 1/1998 | (EP) . |
| 2 250 641 | 6/1992 | (GB) . |

OTHER PUBLICATIONS

International Publication WO 93/1461 (Lanoe), dated Jul. 22, 1993.
International Publication WO 98/42529 (Scheuerer et al.), dated Oct. 1,1998

* cited by examiner

Primary Examiner—William A. Cuchlinski, Jr.
Assistant Examiner—Ronnie Mancho
(74) Attorney, Agent, or Firm—Herbert L. Lerner; Laurence A. Greenberg; Werner H. Stemer

(57) ABSTRACT

An electronic control unit has a housing with a base plate and a plastic hood. A circuit support is fastened to the base plate. A contact pin is fastened in the plastic hood. When the plastic hood is joined to the base plate, the contact pin is plugged through an opening in the base plate and an electric connection between the contact pin and a conductor track support is produced.

12 Claims, 1 Drawing Sheet

ELECTRONIC CONTROL UNIT WITH A CONTACT PIN, AND METHOD OF PRODUCING THE CONTROL UNIT

BACKGROUND OF THE INVENTION

Field of the Invention

The invention relates to an electronic control unit with a housing formed of a base plate and a plastic hood as well as at least one contact pin. The invention further pertains to a method of producing such a control unit. Such electronic control units are used chiefly in motor vehicle technology and serve, in particular, for controlling the engine and/or the automatic transmission.

If such an electronic control unit is to be integrated with the associated sensors completely in an automatic transmission, it must be possible for the electronic control unit to be configured in a hermetically tight fashion. The same holds if an engine controller is constructed as an "in-situ electronic system".

German published, non-prosecuted patent application DE 195 41 925 A1 describes a control unit in which a metal support plate and a substrate supporting conductor tracks are present. Power components are arranged on the support plate in a first region, which is sealed off from a second region. A male connector strip is attached to a metal side of the support plate. Electric contacts are guided through a cutout in the support plate to the conductor tracks of the substrate.

German published, non-prosecuted patent application DE 25 09 507 A1 discloses a housing for integrated circuits which has a base plate and a cover cap. Terminal pins are soldered into the base plate which extend through the base plate and project from the housing.

German published, non-prosecuted patent application DE 43 05 793 A1 describes a power module with semiconductor components arranged on separate support members, arranged one above another, in a housing made from a support plate and a cover hood.

German published, non-prosecuted patent application DE 27 02 173 A1 describes an electronic control unit for transistorized ignition systems, which has a housing made by pressure die-casting and has a plug opening. A seal on a male connector strip is achieved by partially potting the housing with casting resin. The male connector strip must be fastened to a printed circuit board by means of fastening elements. The printed circuit board must, in turn, be screwed on in the housing interior. European patent application EP 0 113 073 A1 discloses an electric switching device for motor vehicles with a moisture-tight housing. The housing part that holds an electric circuit is sealed by a moisture-tight, flexible diaphragm. Plugs are integrated in a moisture-tight fashion in the housing. Connecting parts are provided in the housing interior between the plugs and a printed circuit board. These connecting parts are usually bonding wires.

SUMMARY OF THE INVENTION

It is an object of the invention to provide an electronic control unit with contact pins and an associated production method which renders the control unit particularly easy to produce.

With the foregoing and other objects in view there is provided, in accordance with the invention, an electronic control unit, comprising:

a housing having a base plate and a plastic hood, the base plate having an opening formed therein;

at least one contact pin fastened in the plastic hood and extending through the opening in the base plate;

a circuit support with an electronic control circuit, the circuit support being fastened to the base plate on a side thereof facing the plastic hood; and a conductor track support electrically connecting the contact pin and the circuit support, the conductor track support being fastened to the side of the base plate facing the plastic hood.

With the above and other objects in view there is also provided, in accordance with the invention, a method of producing the electronic control unit, which comprises the following steps:

laminating a conductor track support onto a base plate;

fixing a circuit support onto the conductor track support at least in an edge section thereof with an electrically conducting adhesive;

partially inserting contact pins into a plastic hood;

joining the plastic hood and the base plate such that the contact pins project through openings in the base plate, and an electric connection is produced between the contact pins and the conductor track support.

Due to the fact that an electric connection between a contact pin and the circuit support is made by means of the conductor track support, it is possible to dispense with a complicated connecting method such as, for example, bonding.

In accordance with an added feature of the invention, the conductor track support extends into a contact region between the base plate and the plastic hood. It is very easy to seal the interior surrounded by the plastic hood, since the contact pins need not also be included in the sealed space.

In accordance with an additional feature of the invention, the base plate is a metal or metallized cooling plate. If the base plate is constructed as a cooling plate, the result is a particularly good cooling effect for the electronic control circuit when the circuit support is fastened to the cooling plate by means of a thermally conductive adhesive.

In accordance with another feature of the invention, the conductor track support is glued or laminated onto the base plate, and wherein the hood is sealed fluid tight with respect to the conductor track support in a region between the contact pin and the circuit support.

In accordance with a further feature of the invention, a plurality of plastic sockets are disposed in the openings in the base plate, and the plastic hood is fastened to the base plate via a multiplicity of clamping connections formed between a respective contact pin and a respective plastic socket. By plugging the plastic hood, from which the contact pins project, into the base plate, it is possible in one work operation both to make an electric connection between the contact pins and the circuit carrier, and to achieve a mechanical fastening of the plastic hood to the base plate. In addition, the fastening effect can be enhanced by means of adhesive. In this case, the adhesive can simultaneously be a sealing means for sealing the housing interior.

In accordance with again an added feature of the invention, one conductor track of the conductor track support is clamped between a respective plastic socket/contact pin pair.

In accordance with again another feature of the invention, the circuit support is glued onto the base plate in a central section and is glued to the conductor track support by an electrically conducting adhesive in an edge section.

In accordance with again an additional feature of the invention, the contact pin(s) is/are completely injection-molded into the plastic hood at one end thereof.

In accordance with a concomitant feature of the invention, a contact end of the contact pin projects from a side of the base plate facing away from the plastic hood.

Particularly when a sealing means is provided for the housing interior, it is possible without any problem to achieve sealing even of aggressive fluid media such as transmission oil or gasoline.

Other features which are considered as characteristic for the invention are set forth in the appended claims.

Although the invention is illustrated and described herein as embodied in an electronic control unit with a contact pin, and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
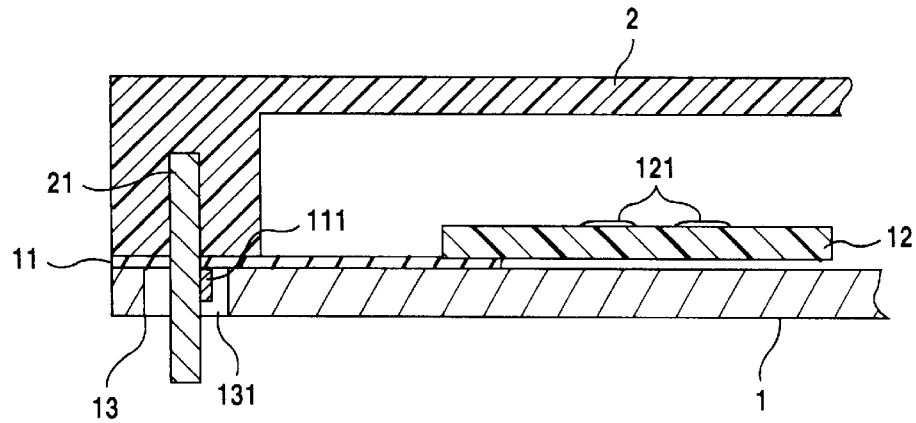
FIG. 1 is a partial section taken through a control unit.

Referring now to the figures of the drawing in detail and first, particularly, to FIG. 1 thereof, there is seen a basic design of an electronic control unit for a fully integrated transmission controller. Such a control unit is disposed inside the oil sump of an automatic transmission. A support part or base plate 1 is constructed as a cooling plate made from aluminum. A conductor track support 11, which is a flexible conductor track film, is laminated onto the base plate 1. Such a conductor track support 11 is well known in the art and includes a conductive layer with conductor tracks 111 and an insulating layer that insulates the conductor tracks 111 from the base plate 1. The laminate connection between the base plate 1 and the conductor track support 11 is absolutely liquid-tight.

The base plate 1 is free from the conductor track support 11 in a central region. The central region is covered by a circuit support 12, which is a ceramic substrate (LTCC). The circuit support 12 carries electronic components 121 of an electronic control circuit.

The circuit support 12 is fixed onto the conductor track support 11 in an edge section by means of an electrically conducting adhesive, for example a silver conductive adhesive. This produces an electrically conducting connection between conductor tracks 111 of the conductor track support and the electronic components 121 of the circuit support. Both the conductor track support 11 and the circuit support have in the contact region mutually facing contact surfaces or pads, which are electrically connected by means of the conducting adhesive and in each case make a connection to a conductor track of the respective medium.

The circuit support 12 is additionally fastened in a central section by means of a thermally conductive adhesive directly to the base plate, which is made from aluminum and simultaneously forms a housing wall of the electronic control unit. As a result, heat can be dissipated in an optimum fashion from the circuit support 12. The base plate 1 can have an elevation in the region of the circuit support, with the result that the surface of the elevation is at the same level as the top edge of the conductor track support.

plastic sockets 131 are inserted in openings 13 of the base plate 1. Before the plastic hood 2 is attached to the base plate 1, a conductor track 111 of the conductor track support 11 extends over the plastic socket 131.

Contact pins 21 project from the plastic hood 2 from the region that is provided for contact with respect to the base plate 1. The contact pins are injected or pressed into the plastic hood.

When the plastic hood 2 is joined to the base plate 1, the contact pins 21 are simultaneously plugged through the plastic sockets 131. In the process, a conductor track 111 of the conductor track support is drawn in each case into the plastic socket 131. As a result, electric contact is made between the contact pin 21 and the respective conductor track 111 that connects the contact pin to the circuit support 12. In this case the plastic socket 131 can have a protrusion projecting in the direction of the contact pin. Such a protrusion ensures reliable electric contact between the conductor track 111 and the contact pin 21, and prevents the conductor track from being torn off.

The opening in the plastic socket 131 is of smaller dimension than the contact pin 21. After the contact pin 21 has been pushed through the plastic socket 131, there is a frictional connection between the contact pin and the plastic socket.

Consequently, mounting the plastic hood 2 on the base plate 1 makes both an electric connection between the contact pins 21 and the circuit support 12 and a mechanical joint between the plastic hood 2 and the base plate 1. Since such a control unit generally has approximately 20 to 30 contact pins 21 distributed over the circumference of the control unit, the connection between the contact pins and the base plate has a sufficient retention force. The latter can additionally be assisted by an adhesive layer in the contact region of the plastic hood. Tightness of the housing is thereby simultaneously improved.

Figure 2:
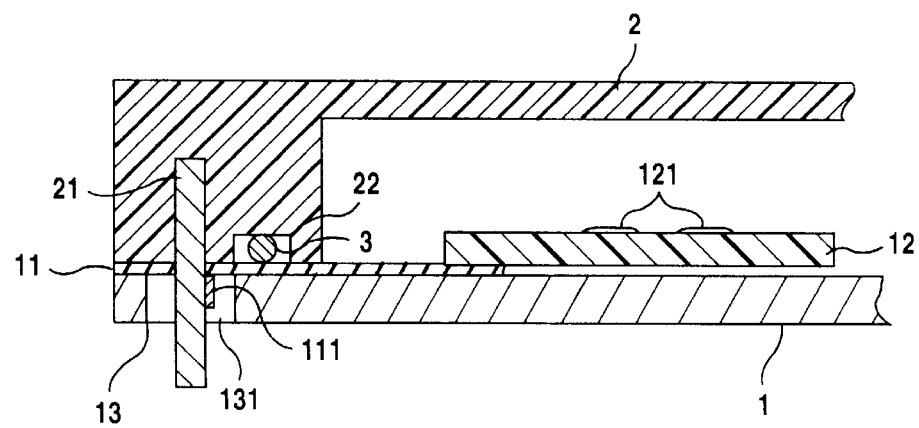
FIG. 2 is a partial sectional view taken through a control unit with a separate sealing element.

Referring now to FIG. 2, the electronic control unit shown it therein has a plastic hood 2 with a circumferential groove 22 in the contact region with respect to the base plate 1 and, more precisely, in the contact region with respect to the conductor track support 11. This groove 22 holds a circumferential seal 3. This seal 3 can be a liquid seal or an O-ring. The seal 3 is arranged closer to the housing interior with respect to the contact pins 21. Consequently, there is no need for the openings 13 in the base plate 1 to be sealed in order to seal the circuit support 12 against a fluid medium such as oil or gasoline.

Figure 3:
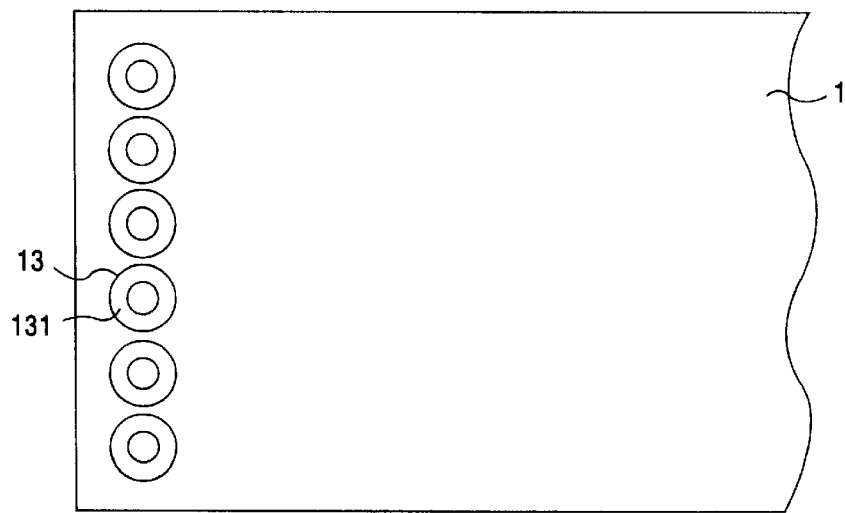
FIG. 3 is a bottom plan view onto the electronic control unit.

FIG. 3 shows a bottom view of an electronic control unit according to the invention. The control unit has a multiplicity of contact pins 21 in an edge region of the base plate 1. The contact pins 21 project at right angles with respect to the base plate 1.

We claim:

1. An electronic control unit, comprising:
   a housing having a base plate and a plastic hood, said base plate having an opening formed therein;
   at least one contact pin fastened in said plastic hood and extending through said opening in said base plate;
   a circuit support with an electronic control circuit, said circuit support being fastened to said base plate on a side thereof facing said plastic hood; and a conductor track support electrically connecting said contact pin and said circuit support, said conductor track support being fastened to the side of said base plate facing said plastic hood.

2. The electronic control unit according to claim 1, wherein said conductor track support extends into a contact region between said base plate and said plastic hood.

3. The electronic control unit according to claim 1, wherein said base plate is a metal cooling plate.

4. The electronic control unit according to claim 1, wherein said base plate is a metallized cooling plate.

5. The electronic control unit according to claim 1, wherein said conductor track support is glued onto said base plate, and wherein said hood is sealed fluid tight with respect to said conductor track support in a region between said contact pin and said circuit support.

6. The electronic control unit according to claim 1, wherein said conductor track support is laminated onto said base plate, and wherein said hood is sealed fluid tight with respect to said conductor track support in a region between said contact pin and said circuit support.

7. The electronic control unit according to claim 1, wherein said opening in said base plate is one of a plurality of openings and said at least one contact pin is one of a plurality of contact pins, and including a plurality of plastic sockets disposed in said openings, and whereby said plastic hood is fastened to said base plate via a multiplicity of clamping connections formed between a respective contact pin and a respective plastic socket.

8. The electronic control unit according to claim 7, wherein one conductor track of said conductor track support is clamped between a respective plastic socket and a respective contact pin.

9. The electronic control unit according to claim 1, wherein said circuit support is glued onto said base plate in a central section and is glued to said conductor track support by an electrically conducting adhesive in an edge section.

10. The electronic control unit according to claim 1, wherein said at least one contact pin is completely injection-molded into said plastic hood at one end thereof.

11. The electronic control unit according to claim 1, wherein said at least one contact pin has a contact end projecting from a side of said base plate facing away from said plastic hood.

12. A method of producing an electronic control unit, which comprises the following steps:

laminating a conductor track support onto a base plate;

fixing a circuit support onto the conductor track support at least in an edge section thereof with an electrically conducting adhesive;

partially inserting contact pins into a plastic hood;

joining the plastic hood and the base plate such that the contact pins project through openings in the base plate, and an electric connection is produced between the contact pins and the conductor track support.

\* \* \* \* \*